United States Patent
Bergemont et al.

(10) Patent No.: US 6,362,023 B1
(45) Date of Patent: Mar. 26, 2002

(54) DIELECTRIC-BASED ANTI-FUSE CELL WITH POLYSILICON CONTACT PLUG AND METHOD FOR ITS MANUFACTURE

(75) Inventors: Albert Bergemont, Palo Alto; Alexander Kalnitsky, San Francisco, both of CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/821,232

(22) Filed: Mar. 29, 2001

Related U.S. Application Data

(62) Division of application No. 09/135,536, filed on Aug. 17, 1998.

(51) Int. Cl.$^7$ .............................. H01L 21/82
(52) U.S. Cl. .................. 438/131; 257/50; 257/530; 438/132
(58) Field of Search ................ 438/131, 132; 257/530, 50

(56) References Cited

U.S. PATENT DOCUMENTS

| | | | |
|---|---|---|---|
| 4,329,706 A | 5/1982 | Crowder et al. | 357/71 |
| 5,354,695 A | 10/1994 | Leedy | 437/7 |
| 5,557,136 A | 9/1996 | Gordon et al. | 257/530 |
| 5,592,016 A * | 1/1997 | Go et al. | 257/530 |
| 5,666,007 A | 9/1997 | Chung | 257/751 |
| 5,731,610 A | 3/1998 | Rhodes | 257/309 |
| 5,811,870 A | 9/1998 | Bhattacharyya et al. | 257/530 |
| 5,986,322 A * | 11/1999 | McCollum et al. | 257/530 |
| 6,016,001 A * | 1/2000 | Sanchez et al. | 257/530 |
| 6,033,938 A * | 3/2000 | Vooget et al. | 438/131 |
| 6,097,077 A * | 8/2000 | Gordon et al. | 257/530 |
| 6,124,193 A * | 9/2000 | Hawley et al. | 438/600 |
| 6,150,199 A * | 11/2000 | Whitten et al. | 438/128 |
| 6,285,168 B1 * | 9/2001 | Kang et al. | 257/530 |

FOREIGN PATENT DOCUMENTS

| JP | 5-90527 | * 4/1993 | .................. 257/50 |
|---|---|---|---|

OTHER PUBLICATIONS

Esmat Hamdy et al., "Dielectric Based Antifuse For Logic and Memory", IEDM Technical Digest, 1988, pp. 786–787.
David K. Y. Liu, "Scaled Dielectric Antifuse Structure for Field–Programmable Gate Array Applications", IEEE Electron Device Letters, vol. 12, No. 4., Apr. 1991, pp. 151–153.

* cited by examiner

*Primary Examiner*—John F. Niebling
*Assistant Examiner*—Jennifer M. Kennedy
(74) *Attorney, Agent, or Firm*—Pillsbury Winthrop LLP

(57) ABSTRACT

A dielectric-based anti-fuse cell and cell array, that include a doped polysilicon contact plug, with a low resistance in the programmed state, a low capacitance, and a small cell area. The dielectric-based anti-fuse cell includes a first insulating layer, typically $SiO_2$, on the surface of a semiconductor substrate. A first doped polysilicon (poly 1) layer is on the upper surface of the first insulating layer and a second insulating layer is over the poly 1 layer. A doped polysilicon contact plug extends through the second insulating layer and into the poly 1 layer. A dielectric layer, typically either an ONO or NO dielectric composite layer, covers the upper surface of the doped polysilicon contact plug. A second doped polysilicon (poly 2) layer is disposed on the dielectric layer.

A process for manufacturing the anti-fuse cell and array includes first providing a semiconductor substrate and forming a first insulating layer on its surface. Next a poly 1 layer (e.g. bit lines) is formed on the surface of the first insulating layer followed by the formation of a second insulating layer over the poly 1 layer. A contact opening that extends into the poly 1 layer is then created in the second insulating layer and filled with a doped polysilicon contact plug. Next, a dielectric layer is formed on the upper surface of the doped polysilicon contact plug, followed by the formation of a poly 2 layer (e.g. word lines) on the upper surface of the dielectric layer.

9 Claims, 5 Drawing Sheets

DIELECTRIC-BASED ANTI-FUSE CELL WITH POLYSILICON CONTACT PLUG AND METHOD FOR ITS MANUFACTURE

This is a divisional of application Ser. No. 09/135,536 filed Aug. 17, 1998.

BACKGROUND OF THE INVENTION

1. Field of the Invention

The present invention relates to integrated circuit device elements and, in particular, to a dielectric-based anti-fuse cell and cell array, with a polysilicon contact plug and methods for their manufacture.

2. Description of the Related Art

Anti-fuse cells (also known as fusible links) are used as programmable interconnections in logic integrated circuit (IC) devices, such as Field Programmable Gate Arrays (FPGA), and memory IC devices.

A conventional oxide-nitride-oxide (ONO) dielectric-based anti-fuse cell is illustrated in FIG. 1. ONO dielectric-based anti-fuse cell 10 includes an N+ diffusion region 12 disposed on a semiconductor substrate 14. ONO dielectric layer 16 and doped polysilicon layer 18 are disposed above the N+ diffusion region 12. The doped polysilicon layer 18 and the N+ diffusion region 12 are separated by both the ONO dielectric layer 16 and an insulating layer 20, except in one region where the separation is accomplished solely by the ONO dielectric layer 16. Insulating layer 20 is also disposed on the upper surface of semiconductor substrate 14. As illustrated in FIG. 1, a portion of the N+ diffusion region 12 lies under a gap in the insulating layer 20, with the doped polysilicon layer 18 and its underlying ONO dielectric layer 16 filling the gap.

The ONO dielectric-based anti-fuse cell 10 of FIG. 1 is programmed to a conductive state by applying a voltage across the ONO dielectric layer 16 (i.e. the voltage is applied between the N+ diffusion region 12 and doped polysilicon layer 18 at the "gap" in the insulating layer 20) sufficient to rupture the ONO dielectric layer at the gap. Additional details of ONO-based anti-fuses, such as the anti-fuse cell illustrated in FIG. 1, are described in E. Hamdy et al., Dielectric Based Antifuse for Logic and Memory ICs, Technical Digest of the International Electron Devices Meeting, 786–787 (1988), which is hereby fully incorporated by reference.

A conventional dual-polysilicon and nitride-oxide (NO) dielectric-based anti-fuse cell 30 for use in FPGA applications is illustrated in FIG. 2. Anti-fuse cell 30 includes a doped polysilicon (poly 1) layer 32 that is separated from semiconductor substrate 34 by first insulating layer 36 (typically silicon dioxide). A second insulating layer 38 (typically silicon dioxide), with an opening therethrough, is disposed on the upper surface of poly 1 layer 32. A portion of the upper surface of the poly 1 layer 32 is exposed through the opening in the second insulating layer 38. A layer of NO dielectric 40 is disposed on the surface of second insulating layer 38, including on the sidewalls of the opening, and on the portion of the poly 1 layer that is exposed through the opening. A second doped polysilicon (poly 2) layer 42 overlies the layer of NO-dielectric 40 and further fills the opening in the second insulating layer 38.

The dual-polysilicon NO dielectric-based anti-fuse cell of FIG. 2 is programmed to a conductive state by applying a voltage across the layer of NO dielectric 40 (i.e. the voltage is applied between the poly 1 layer 32 and the poly 2 layer 42 at the opening in the second insulating layer 38) sufficient to rupture the NO dielectric at the opening. The use of an NO dielectric layer, rather than an ONO dielectric layer, reduces the voltage required to rupture the dielectric. See David K. Y. Liu et al., Scaled Dielectric Antifuse Structure for Field Programmable Gate Array Applications, IEEE Electron Device Letters, Vol. 12, No. 4, 151–153 (1991), which is hereby fully incorporated by reference, for a further description of dual-polysilicon NO dielectric-based anti-fuse elements.

Prior to being programmed, a dielectric-based anti-fuse cell is in a high resistance state due to the presence of a dielectric layer (either ONO or NO) separating the conductive layers (either a doped diffusion region in a semiconductor substrate or a doped polysilicon layer). After the anti-fuse cell is programmed (i.e. the dielectric is ruptured) by the application of a voltage ("anti-fuse programming voltage"), the anti-fuse cell assumes a relatively low resistance state and therefore becomes more conductive. In this "programmed" state, the resistance of the anti-fuse cell is dependent on the area and electrical properties of the contact between the conductive layers. The series resistance of a cell array is proportional to the length of the polysilicon lines connecting individual anti-fuse cells of the array.

Reducing (i.e. "scaling") the anti-fuse programming voltage of dielectric-based anti-fuses often requires thinning the dielectric layer. However, thinning the dielectric layer increases the anti-fuse capacitance, which causes an undesirable decrease in integrated circuit device speed (i.e. an increase in the time delay). The capacitance of the anti-fuse in the non-programmed state can be reduced by minimizing the contact area of the anti-fuse. However, when the contact area of a conventional anti-fuse is reduced, the resistance of the anti-fuse is increased, resulting in a reduction in device speed. In addition, there is a reduction in device speed due to the preexistence of undesirable anti-fuse cell array capacitance associated with the polysilicon lines employed to connect the individual cells of the array (e.g. capacitance between polysilicon lines and the substrate).

Still needed in the art is a dielectric-based anti-fuse cell, and a process for its manufacture, that allows for the area of the anti-fuse dielectric to be scaled along with the dielectric thickness, while still providing an anti-fuse cell with a low capacitance and a low resistance in the programmed state. It is desirable that the dielectric-based anti-fuse have a relatively small contact area, thereby decreasing anti-fuse capacitance while providing for an increased cell layout density with low series resistance. Also needed is a anti-fuse cell array with a low resistance in the programmed state, a low capacitance, a small cell area and high cell density. The process of manufacture for the cell and cell array should be simple and fully compatible with conventional Complimentary-Metal-Oxide-Semiconductor (CMOS) processing.

SUMMARY OF THE INVENTION

The present invention provides a dielectric-based anti-fuse cell, having a doped polysilicon contact plug, with a low resistance in the programmed state, a low capacitance, and a small cell area.

The anti-fuse cell includes a first insulating layer, typically $SiO_2$, on the surface of a semiconductor substrate such as a silicon wafer. A first doped polysilicon (poly 1) layer is disposed on the upper surface of the first insulating layer and a second insulating layer covers the poly 1 layer.

The anti-fuse cell also includes a doped polysilicon contact plug that extends from the upper surface of the second insulating layer, through the second insulating layer and into the poly 1 layer. A dielectric layer, such as an ONO dielectric composite layer or an NO dielectric composite layer, covers the upper surface of the doped polysilicon contact plug. A second doped polysilicon (poly 2) layer is disposed on the dielectric layer. The poly 1 and poly 2 layers can optionally include a layer of metal silicide on their upper surfaces.

This anti-fuse structure provides a low capacitance anti-fuse cell since the contact area between the dielectric layer and the doped polysilicon contact plug can be manufactured at the minimum dimension which the manufacturing process is capable of producing. The structure also provides an anti-fuse cell with a low resistance in the programmed state since the doped polysilicon contact plug is electrically connected to the poly 1 layer along the relatively large sidewall area of the doped polysilicon contact plug. The area of the anti-fuse cell, according to the present invention, can be reduced to a minimum since its doped polysilicon contact plug can be produced to the smallest size possible for a given process technology. The small anti-fuse cell area provides for a compact array layout with short polysilicon lines connecting the individual cells, decreasing the series resistance and capacitance of the cell array.

Also provided is a process for manufacturing a dielectric-based anti-fuse cell with a doped polysilicon contact plug that is simple (and therefore inexpensive) and compatible with conventional CMOS processing.

The process includes first providing a semiconductor substrate and forming a first insulating layer on its surface. Next a first doped polysilicon (poly 1) layer is formed on the surface of the first insulating layer followed by the formation of a second insulating layer over the poly 1 layer.

A contact opening is then created that extends from the upper surface of, and through, the second insulating layer and into the poly 1 layer. A doped polysilicon plug layer (i.e. the precursor to the doped polysilicon contact plug) is then formed on the upper surface of the second isolating layer and in the contact opening. The doped polysilicon plug layer is subsequently removed everywhere except in the contact opening, thereby forming a doped polysilicon contact plug in the contact opening.

Next, a dielectric layer, such as an ONO or NO layer, is formed on the upper surface of the doped polysilicon contact plug and the second insulating layer, followed by the formation of a second doped polysilicon (poly 2) layer on the upper surface of the dielectric layer.

Each of these process steps can be accomplished utilizing conventional CMOS processing techniques. Furthermore, a relatively small number of additional steps are needed compared to manufacturing processes of conventional dielectric-based anti-fuse cells.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings of which.

DETAILED DESCRIPTION OF THE INVENTION

Figure 1:
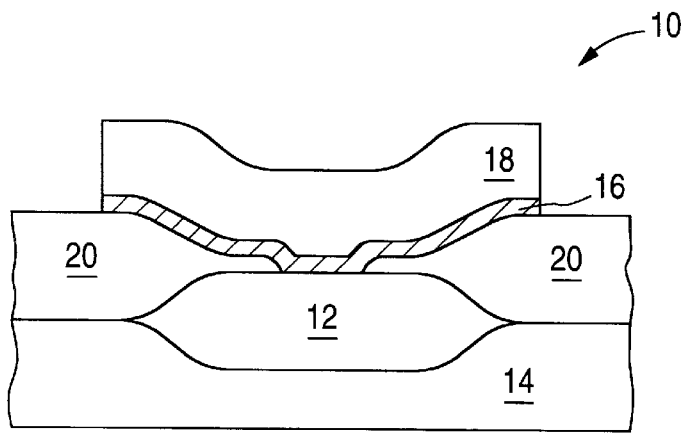
FIG. 1 is a cross-sectional representation of a conventional ONO dielectric-based anti-fuse cell for connecting a polysilicon layer and a diffusion region.
Figure 2:
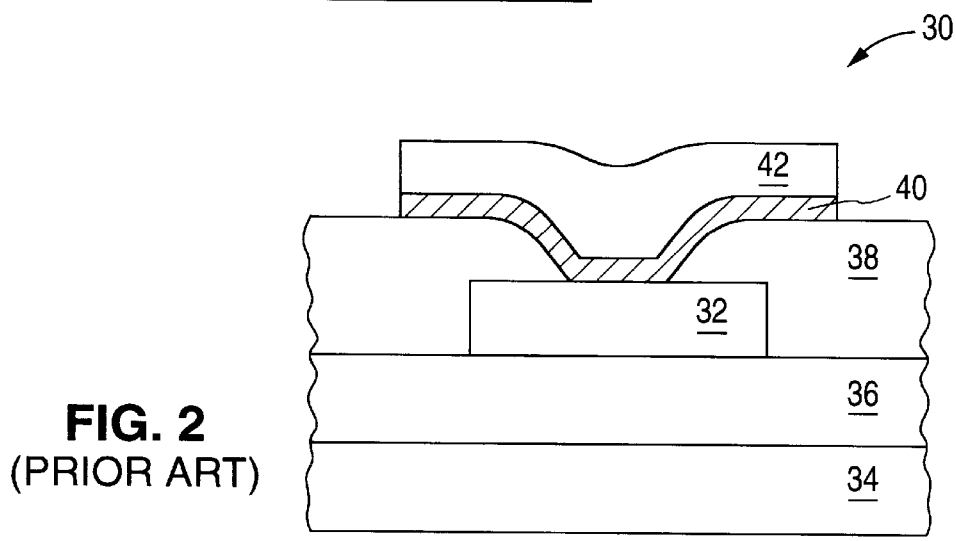
FIG. 2 is a cross-sectional representation of a conventional dual-polysilicon NO dielectric-based anti-fuse cell.
Figure 3:
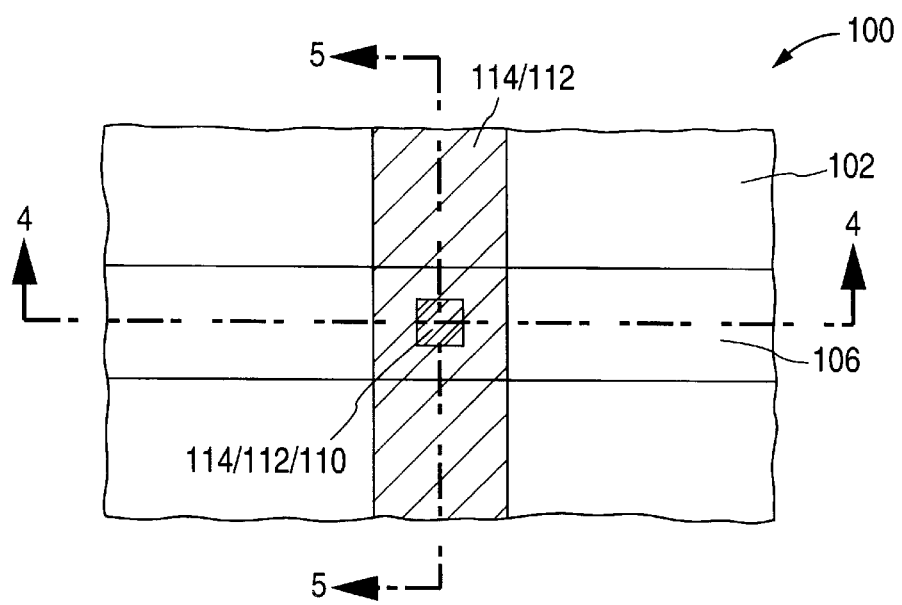
FIG. 3 is a layout representation of a dielectric-based anti-fuse cell according to the present invention.
Figure 4:
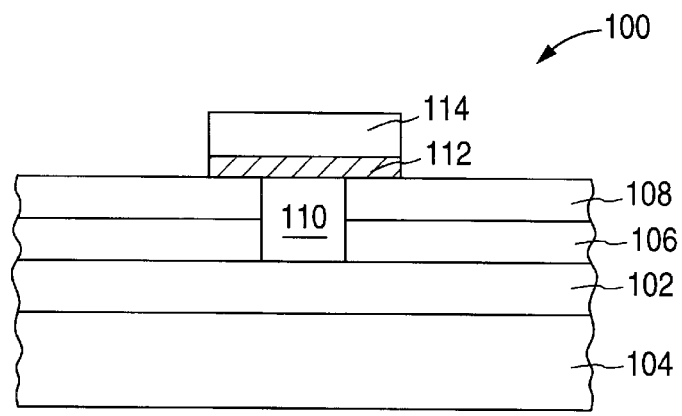
FIG. 4 is a cross-sectional representation of the dielectric-based anti-fuse cell of FIG. 3 taking along the line 4—4.
Figure 5:
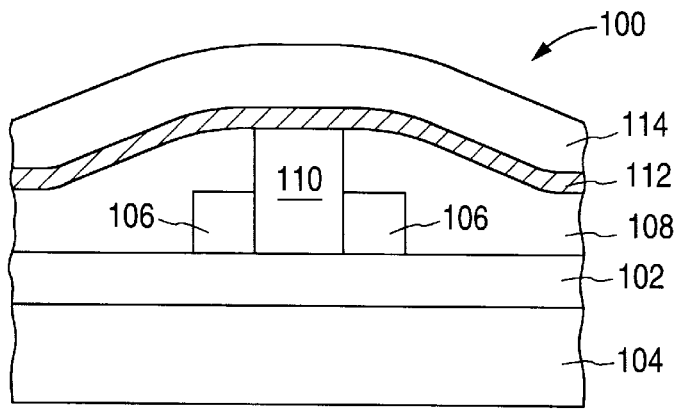
FIG. 5 is a cross-sectional representation of the dielectric-based anti-fuse cell of FIG. 3 taking along the line 5—5.

FIGS. 3–5 illustrate a dielectric-based anti-fuse cell with a polysilicon contact plug according to the present invention. A dielectric-based anti-fuse cell 100 includes a first insulating layer 102 on the upper surface of a semiconductor substrate 104. First insulating layer 102 is typically made of thermally grown silicon dioxide ($SiO_2$) and has a thickness of several thousand angstroms. First insulating layer 102 can also be formed of any electrically insulating material (e.g. silicon nitride) known to those of ordinary skill in the art. Semiconductor substrate 104 is typically a bare silicon wafer but other known semiconductor substrates, such as germanium, gallium arsenide, or silicon-on-insulator (SOI), can also be utilized. In addition, semiconductor substrate 104 can be a silicon wafer at any stage during the fabrication of an integrated circuit, including those stages where multiple patterned and/or unpatterned layers exist on the surface of the wafer.

First doped polysilicon (poly 1) layer 106 is disposed on the upper surface of first isolation layer 102. Poly 1 layer 106, which is typically 1000 to 5000 Å in thickness, can be doped by conventional processes such as ion implantation, $POCl_3$-based phosphorous doping, or in-situ doping during deposition of the poly 1 layer. Typical poly 1 doping levels are greater than $5E19/cm^3$.

Second insulating layer 108 is arranged on the upper surface of the poly 1 layer 106. Second insulating layer 108 is typically a deposited silicon dioxide ($SiO_2$), but can be made of any insulating material known in the art. The thickness of second insulating layer 108 is set by two competing factors: (i) the need for a low parasitic capacitance, which requires a thick second insulating layer; and (ii) the desire to minimize the height, and thus the series resistance, of the doped polysilicon contact plug 110 described below, which requires a thin second insulating layer. The minimum thickness of the second insulating layer is the thickness required to avoid electrical shorts between the various conductive layers of the anti-fuse cell. The typical thickness of the second insulating layer is between 1000 angstroms and 1 micron.

A doped polysilicon contact plug 110 extends from and through the upper surface of the second insulating layer 108, and through the poly 1 layer 106. The doped polysilicon contact plug 110 terminates at the first insulating layer 102. Doping level of the doped polysilicon contact plug are typically greater than $5E19/cm^3$.

The width of the doped polysilicon contact plug 110 is approximately equal to the smallest dimension that can be patterned by a given process technology. For example, if the anti-fuse cell is manufactured using a 0.25 micron process technology, the width of the doped polysilicon contact plug will be in the vicinity of 0.25 microns, typically 0.30 microns. For this reason, by employing a doped polysilicon contact plug, the area of the anti-fuse cell is minimized and the density of the anti-fuse cell layout consequently is compact. In addition, since the contact area between the doped polysilicon contact plug 110 and the dielectric layer 112 is minimized, the anti-fuse cell capacitance is low.

As apparent from FIGS. 4 and 5, the height (i.e. thickness) of the doped polysilicon contact plug 110 is essentially defined by the combined thickness of the second insulating layer 108 above the poly 1 layer 106 and the extension depth of the doped polysilicon contact plug into the poly 1 layer 106. The upper surface of the doped polysilicon contact plug 110 can be recessed below the upper surface of the second insulating layer 108 or that the doped polysilicon contact plug may not extend entirely through the poly 1 layer 106. To achieve the best effect, the doped polysilicon contact plug 110 should, however, extend as far into the poly 1 layer 106 as practical, depending on the manufacturing processes used. The farther the doped polysilicon contact plug 110 is extended into the poly 1 layer 106, the larger is the provided peripheral (sidewall surface) contact area between the doped polysilicon contact plug 110 and the poly 1 layer 106. A large peripheral surface contact area reduces the resistance of the anti-fuse cell, and thus the series resistance of any array of individual cells. The low series resistance improves integrated device speed.

A dielectric layer 112 is disposed over the upper surface of the doped polysilicon contact plug 110 and the second insulating layer 108. Dielectric layer 112 can be, for example, a nitride ($Si_3N_4$)/oxynitride (referred to as NO) dielectric composite layer or a $SiO_2$/nitride/oxynitride (referred to as oxide-nitride-oxynitride or ONO) dielectric composite layer. The thickness of the dielectric layer 112 is a function of the desired anti-fuse programming voltage to be used. A typical NO dielectric composite layer would have a nitride thickness in the range of 30 to 200 angstroms and an oxynitride thickness in the range of 15 to 100 angstroms.

A second doped polysilicon (poly 2) layer 114 is disposed on the upper surface of the dielectric layer 112. Poly 2 layer 114, which is typically 1000 to 5000 Å in thickness, can be doped by conventional processes such as ion implantation, $POCl_3$-based phosphorous doping, or in-situ doping during deposition of the poly 2 layer. Doping levels of the poly 2 layer are usually greater than $5E19/cm^3$.

As described above, dielectric-based anti-fuse cells according to the present invention provide several advantages over conventional anti-fuse cells. First, the anti-fuse cell capacitance is low due to the small area of the anti-fuse cell. This low capacitance improves device speed. Second, the anti-fuse series resistance is low due to the presence of a large contact area between the doped polysilicon contact plug and the poly 1 layer. This also improves device speed. Third, the dielectric-based anti-fuse cell occupies a very small area since the doped polysilicon contact plug can be sized at the minimum geometry of a given process technology.

Figure 6:
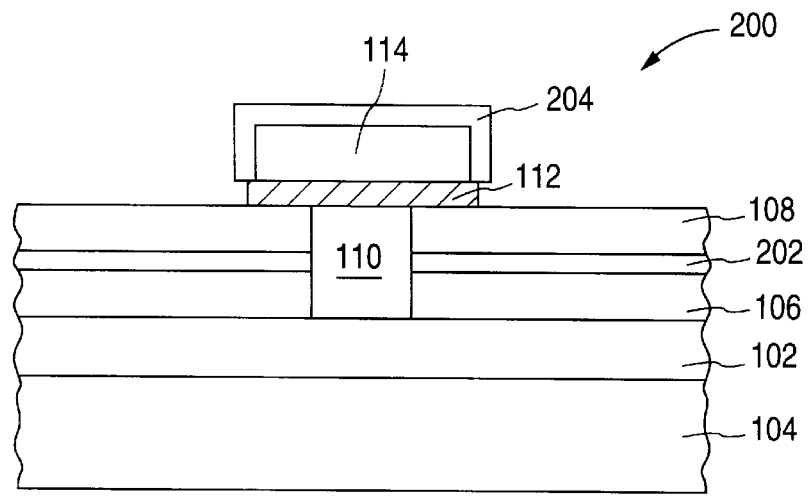
FIG. 6 is a cross-sectional representation of an alternative dielectric-based anti-fuse cell according to the present invention.

FIG. 6 illustrates an alternative dielectric-based anti-fuse cell embodiment with a doped polysilicon contact plug according to the present invention. In FIG. 6, like reference numerals designate like elements as in FIG. 4. Dielectric-based anti-fuse cell 200 contains each of the elements of dielectric-based anti-fuse cell 100 of FIG. 4, with the addition of a first metal silicide layer 202 between the poly 1 layer 106 and the second insulating layer, as well as a second metal silicide layer 204 covering the poly 2 layer 114. The presence of metal silicide layers on the poly 1 and poly 2 layers reduces the contribution of these layers to the overall anti-fuse resistance and improves integrated circuit device speed.

The thickness of the metal silicide layers, 202 and 204, is typically between 100 and 1000 angstroms. The metal silicide layers can include any metal silicide known to those with ordinary skill in the art, such as titanium silicide, tungsten silicide, cobalt silicide or tantalum silicide, molybdenum silicide, nickel silicide, and palladium silicide.

Figure 7:
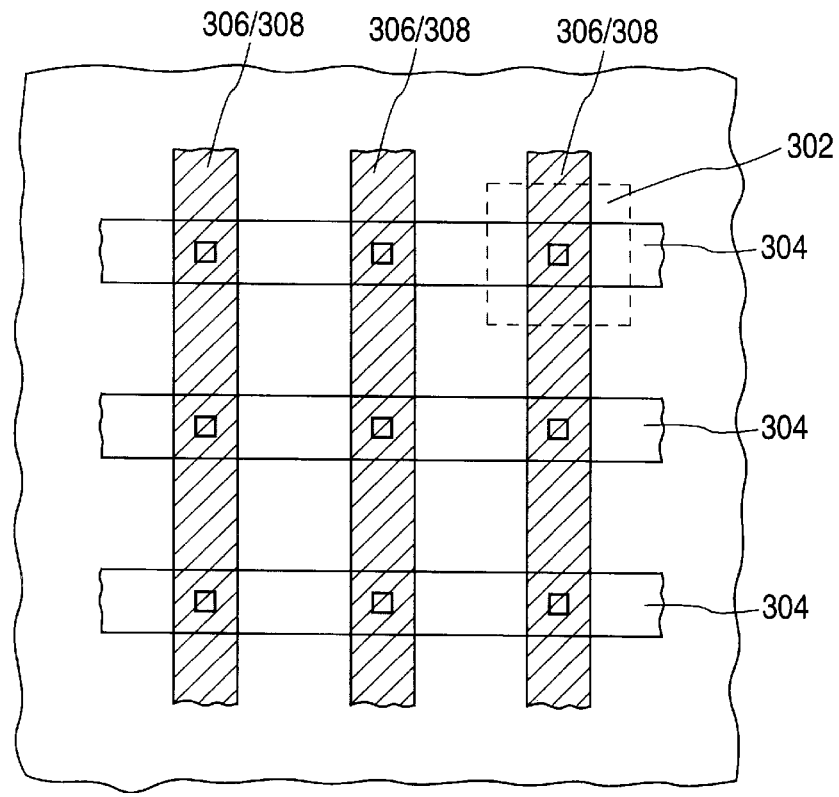
FIG. 7 is a layout representation of a dielectric-based anti-fuse cell array according to the present invention.

FIG. 7 illustrates, in layout format, a dielectric-based anti-fuse cell array with doped polysilicon contact plugs according to the present invention. It is anticipated that such an array can be utilized in FPGA integrated circuits. The dielectric-based anti-fuse cell array 300 includes a plurality of dielectric-based anti-fuse cells with doped polysilicon contact plugs. In the array 300, the poly 1 layer of each of the individual dielectric-based anti-fuse cells with doped polysilicon contact plugs 302 (delineated by a segmented line) takes the form of a plurality of first doped polysilicon (poly 1) lines 304 (for example, the bit lines of a FPGA integrated circuit). The poly 2 layer of each of the individual cells 302 takes the form of a plurality of second doped polysilicon (poly 2) lines 306 (for example, the word lines of a FPGA integrated circuit). The poly 2 lines 306 overlie a dielectric layer 308. In FIG. 7, the poly 2 lines 306 and their underlying dielectric layers 308 are, therefore, represented by diagonal slashes and marked by the combined reference numeral 306/308.

The individual anti-fuse cells are arranged in an "array" pattern such that each anti-fuse cell 302 is connected to the anti-fuse cell directly above and below it (in a two dimensional sense) by its poly 2 line 306 and is connected to the anti-fuse cells to the immediate left and right (also in two dimensional sense) by its poly 1 line 304. FIGS. 4 and 5, described above, serve as cross-sectional representations of the individual anti-fuse cells 302. The individual anti-fuse cells 302 can optionally include a metal silicide layer on the surface of the poly 1 lines 304 and poly 2 lines 306, as illustrated in and described in conjunction with FIG. 6.

The poly 1 lines 304 and poly 2 lines 306 have a width that is greater than the width of the doped polysilicon contact plug in order to provide for potential misalignment between the these elements. For example, if a 0.25 micron process technology is used to manufacture the array 300, the width of the doped polysilicon contact plug is approximately 0.30 microns. The width of the poly 1 lines 304 and poly 2 lines 306 is then set at 0.5 microns to provide an overlap of 0.10 microns on each side of the doped polysilicon contact.

Since the structure of the inventive dielectric-based anti-fuse cell with a doped polysilicon contact plug provides a relatively large sidewall contact area between the doped polysilicon contact plug and the poly 1 line, the anti-fuse cell is very tolerant of mis-alignment between the doped polysilicon contact plug and the poly 1 line. The doped polysilicon contact plug can be misaligned such that it is off-center with the poly 1 line and still provide a sufficient contact area between the doped polysilicon contact plug and the poly 1 line. This tolerance to misalignment permits a reduction in the poly 1 line width, and hence a reduction in total cell size, compared to conventional anti-fuse cells. This is possible because the poly 1 line width of the present invention does not need not be increased as much as in a conventional anti-fuse cells, in order to compensate for potential misalignment. The reduction in total cell size decreases the length of the polysilicon lines needed to connect individual cells and thus lowers the overall series resistance and capacitance of the cell array.

Also provided is a process for manufacturing a dielectric-based anti-fuse cell with a doped polysilicon contact plug. FIGS. 8–17 illustrate various stages of such a process.

Figure 8:
FIGS. 8–17 are cross-sectional views illustrating stages in a process of manufacturing the dielectric-based anti-fuse cell in accordance with the present invention.
Figure 9:
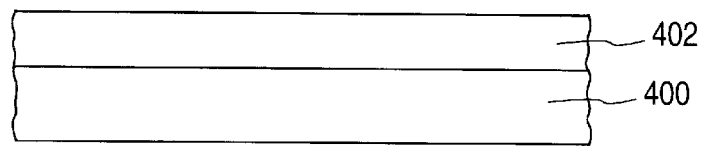

Referring to FIG. 8, a semiconductor substrate 400 is first provided. Next, as illustrated in FIG. 9, a first insulating layer 402 is formed on the upper surface of the semiconductor substrate 400. First insulating layer 402 can be formed, for example, by conventional thermal processes, such as LOCal Oxidation of Silicon (LOCOS). The thickness of the first insulating layer 402 is typically about 5500 angstroms, although a first insulating layer of different thickness may be employed.

Figure 10:
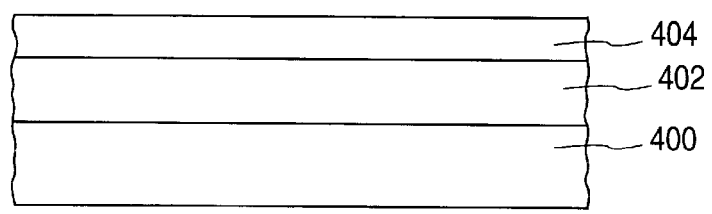

A first doped polysilicon (poly 1) layer 404 of 1000–5000 angstroms in thickness is then formed on the surface of first insulating layer 402 by conventional processes known to those skilled in the art, such as in situ doped low pressure chemical vapor deposition (LPCVD) of the poly 1 layer 404 or deposition of a polysilicon layer followed by conventional ion implantation doping. The resulting structure is illustrated in FIG. 10. The poly 1 layer can be patterned to a predetermined shape by conventional processes, such as photolithography and etching. For example, the poly 1 layer may be patterned to provide a plurality of poly 1 lines 304 as shown in FIG. 7.

Figure 11:
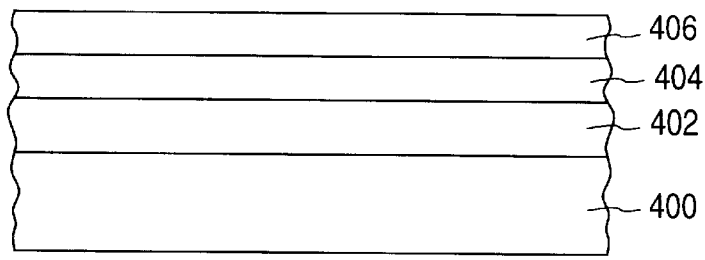

Next, as illustrated in FIG. 11, a second insulating layer 406, typically 1000 angstroms to 1 micron thick, is formed on the upper surface of the poly 1 layer 404.

Figure 12:
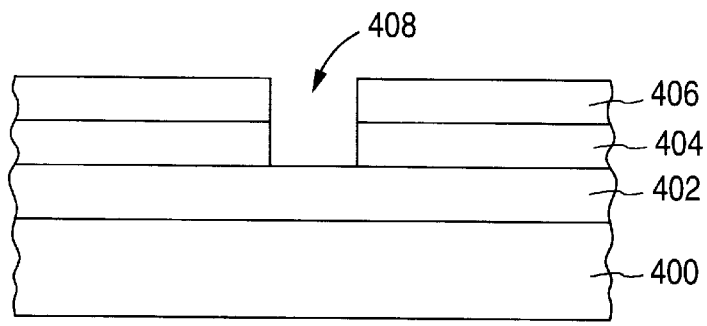

A contact opening 408 is then etched through the second insulating layer 406 and at least partially through the poly 1 layer 404, as illustrated in FIG. 12, using conventional photolithographic and etching processes known to those of ordinary skill in the art. The contact opening 408, therefore, exposes a portion of the poly 1 layer 404.

Figure 13:
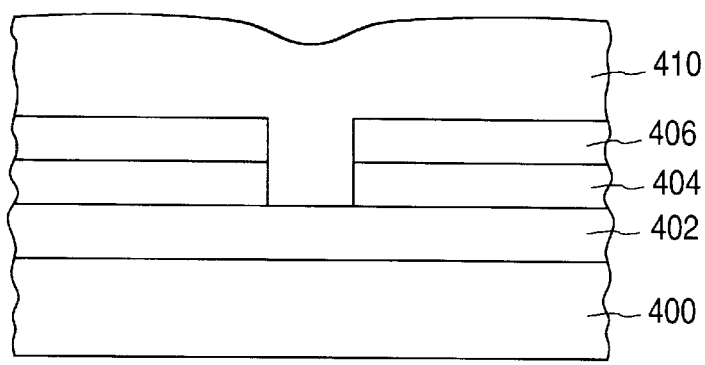
Figure 14:
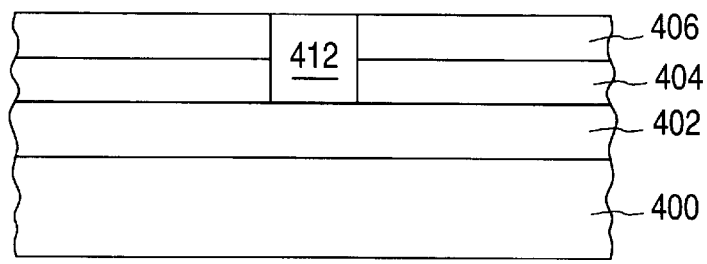

Next, a doped polysilicon plug layer (i.e. the precursor to doped polysilicon contact plug) 410 is formed on the surface of the second insulating layer 406 and filling the contact opening 408, as illustrated in FIG. 13. The thickness of the doped polysilicon plug layer 410 should be greater than one half the width of the contact opening 408 in order to insure that the contact opening is completely filled. The doped polysilicon plug layer 410 can be formed by conventional processes known to those skilled in the art, such as in situ doped LPCVD or deposition of a polysilicon layer followed by ion implantation. In situ doping processes are preferred since they eliminates the need for subsequent thermal processing to distribute the dopant throughout the polysilicon.

The doped polysilicon plug layer 410 is subsequently removed from everywhere except in the contact opening 408. The doped polysilicon plug layer remaining in the contact opening 408 is referred to as a doped polysilicon contact plug 412 (see FIG. 14). This removal can be accomplished, for example, by either etching back the doped polysilicon plug layer or through the use of Chemical Mechanical Polishing (CMP) techniques. After the removal step, the upper surface of the doped polysilicon contact plug 412 may be several hundred angstroms over or under the upper surface of the second insulating layer 406. Such a recessed or protruding doped polysilicon contact plug is acceptable as long as its upper area (which will be in contact with the dielectric layer) is small enough to provide a low capacitance anti-fuse cell.

Figure 15:
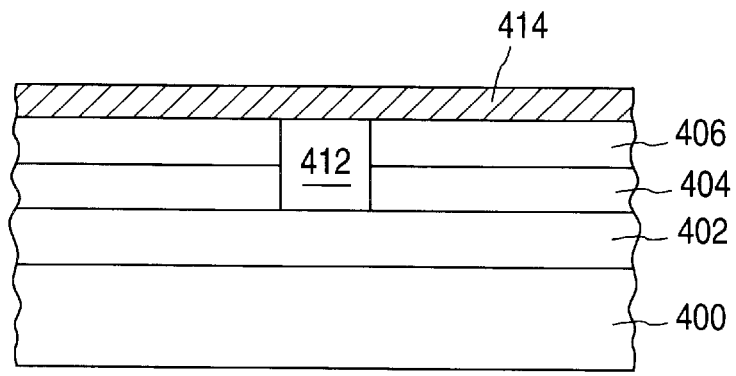

Next, a dielectric layer 414 is formed on the upper surface of the second insulating layer 406 and the upper surface of the doped polysilicon contact plug 412, as depicted in FIG. 15. As discussed earlier with reference to dielectric layer 112, dielectric layer 414 can be an NO dielectric composite layer or an ONO dielectric composite layer. An NO dielectric composite layer can be formed by, for example, depositing a layer of silicon nitride (using conventional techniques) followed by the thermal oxidation of an upper portion of the silicon nitride layer to form a layer of oxynitride. A typical NO dielectric composite layer would have a nitride thickness in the range of 30 to 200 angstroms and an oxynitride thickness in the range of 15 to 100 angstroms. The NO dielectric composite layer breakdown voltage for the lower limit of nitride thickness is approximately 5 volts.

Figure 16:
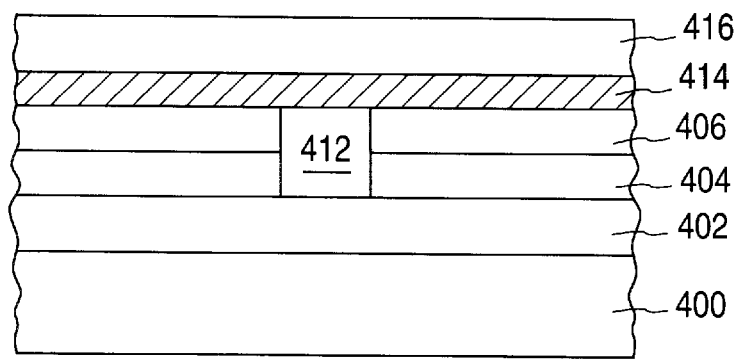
Figure 17:
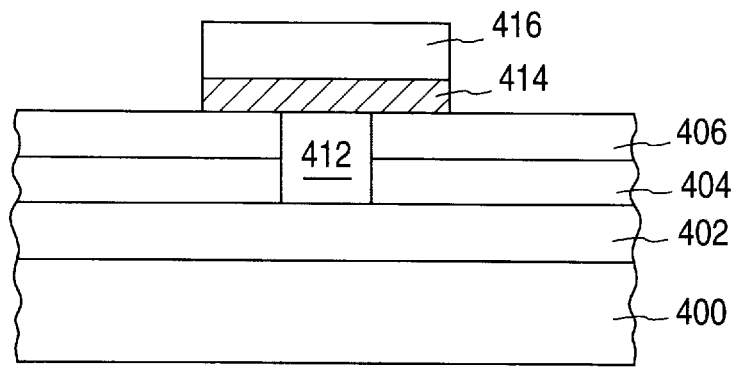

Subsequent to the formation of a dielectric layer 414, a second doped polysilicon (poly 2) layer 416 of 1000 to 5000 angstroms in thickness is formed on the upper surface of the dielectric layer 414, as shown in FIG. 16. The poly 2 layer 416 and its underlying dielectric layer 414 can be patterned to a predetermined shape by conventional processes such as photolithography and self-aligned etching. For example, the poly 2 layer may be patterned to provide a plurality of poly 2 lines 306 as in FIG. 7. The resultant structure of the dielectric-based anti-fuse cell with a doped polysilicon contact plug is illustrated in FIG. 17.

In an alternative embodiment of the inventive process, a first layer of metal silicide is formed on the surface of the poly 1 layer prior to formation of the second isolation layer, while a second layer of metal silicide is formed on the poly 2 layer subsequent to the self-aligned etch of the poly 2 layer and underlying dielectric layer. The resultant structure of a dielectric-based anti-fuse cell with a polysilicon contact plug is illustrated in FIG. 6.

The processes according to the present invention are fully compatible with conventional CMOS processing since the unique sequence of steps can be performed using conventional CMOS layer formation techniques (thermal and/or CVD), conventional doping techniques (e.g. in situ doping during polysilicon deposition), conventional photolithographic and etching processes, and conventional CMP processes. The processes are also relatively simple, requiring only 1 additional polysilicon layer formation (i.e. the doped polysilicon plug layer) and a doped polysilicon plug layer removal step to form a doped polysilicon contact plug. The process according to the present invention combines simplicity with conventional CMOS processing techniques, to provide for a low cost dielectric-based anti-fuse cell, and cell array, with a doped polysilicon contact plug.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method for manufacturing a dielectric-based anti-fuse cell with a polysilicon contact plug, the method comprising the steps of:
   providing a semiconductor substrate;
   forming a first insulating layer on the semiconductor substrate;
   forming a first doped polysilicon (poly 1) layer on the first insulating layer;
   forming a second insulating layer over the poly 1 layer;
   creating a contact opening through the second insulating layer, the contact opening extending at least partially into the poly 1 layer and exposing a portion of the poly 1 layer;

forming a doped polysilicon plug layer on the second insulating layer and filling the contact opening;

removing the doped polysilicon plug layer from the second insulating layer while leaving the doped polysilicon plug layer filling the contact opening, thereby forming a doped polysilicon contact plug;

forming a dielectric layer on the second insulating layer and on the doped polysilicon contact plug; and forming a second doped polysilicon (poly 2) layer on the dielectric layer.

2. The method of claim 1 further including the step of:

forming a first metal silicide layer on the poly 1 layer between the step of forming a poly 1 layer and the step of forming a second insulating layer.

3. The method of claim 1 further including the step of:

forming a second metal silicide layer on the poly 2 layer.

4. The method of claim 1 further including the steps of:

patterning the poly 1 layer following the step of forming a poly 1 layer and prior to the step of forming a second insulating layer; and patterning the poly 2 layer and dielectric layer following the step of forming a poly 2 layer.

5. The method of claim 4 wherein the step of patterning the poly 2 layer and dielectric layer includes etching the poly 2 layer and dielectric layer using a self-aligned etch.

6. The method of claim 1 wherein the step of creating a contact opening includes creating a contact opening entirely through the poly 1 layer.

7. A method for forming an anti-fuse cell array comprising the steps of:

providing a semiconductor substrate;

forming a first insulating layer on the surface of the semiconductor substrate;

forming a plurality of doped polysilicon (poly 1) lines on the insulating layer;

forming a second insulating layer over the plurality of poly 1 lines;

creating a plurality of contact openings through the second insulating layer and extending at least partially into the plurality of poly 1 lines, the plurality of contact openings exposing a portion of the plurality of poly 1 lines;

forming a doped polysilicon plug layer on the second insulating layer and filling the plurality of contact openings;

removing the doped polysilicon plug layer from the second insulating layer while leaving the doped polysilicon plug layer filling the plurality of contact openings, thereby forming a plurality of doped polysilicon contact plug;

forming a dielectric layer on the second insulating layer and on the plurality of doped polysilicon contact plug; and forming a plurality if second doped polysilicon (poly 2) lines on the dielectric layer.

8. The method of claim 7 wherein the step of forming a plurality of poly 1 lines includes forming a plurality of poly 1 lines that are bit lines of a field programmable gate array integrated circuit.

9. The method of claim 7 wherein the step of forming a plurality of poly 2 lines includes forming a plurality of poly 2 lines that are word lines of a field programmable gate array integrated circuit.

* * * * *

UNITED STATES PATENT AND TRADEMARK OFFICE
CERTIFICATE OF CORRECTION

PATENT NO. : 6,362,023 B1
DATED : March 26, 2002
INVENTOR(S) : Albert Bergemont et al.

It is certified that error appears in the above-identified patent and that said Letters Patent is hereby corrected as shown below:

<u>Column 10,</u>
Line 23, delete "if" and replace with -- of --.

Signed and Sealed this

Fourth Day of June, 2002

Attest:

JAMES E. ROGAN
Attesting Officer    Director of the United States Patent and Trademark Office